(12) United States Patent
Fotoohi

(10) Patent No.: US 10,345,356 B2
(45) Date of Patent: Jul. 9, 2019

(54) SYSTEM AND METHOD FOR PROTECTION AGAINST ELECTRIC SHOCK

(71) Applicant: Parviz Fotoohi, Isfahan (IR)

(72) Inventor: Parviz Fotoohi, Isfahan (IR)

( * ) Notice: Subject to any disclaimer, the term of this patent is extended or adjusted under 35 U.S.C. 154(b) by 129 days.

(21) Appl. No.: 15/458,953

(22) Filed: Mar. 14, 2017

(65) Prior Publication Data

US 2017/0184653 A1 Jun. 29, 2017

Related U.S. Application Data

(60) Provisional application No. 62/307,593, filed on Mar. 14, 2016.

(51) Int. Cl.
| | | |
|---|---|---|
| *G05B 9/02* | (2006.01) | |
| *G01R 31/02* | (2006.01) | |
| *G01R 15/18* | (2006.01) | |
| *H02H 3/30* | (2006.01) | |

(52) U.S. Cl.
CPC ......... *G01R 31/025* (2013.01); *G01R 15/181* (2013.01); *G05B 9/02* (2013.01); *H02H 3/305* (2013.01)

(58) Field of Classification Search
CPC ...... G01R 31/025; G01R 15/181; G05B 9/02; H02H 3/305
USPC .......................................................... 307/326
See application file for complete search history.

(56) References Cited

U.S. PATENT DOCUMENTS

| | | |
|---|---|---|
| 7,633,726 B2 | 12/2009 | Huang et al. |
| 8,847,712 B2 | 9/2014 | Chen |
| 9,397,494 B2 | 7/2016 | Hofheinz et al. |
| 2007/0285267 A1 | 12/2007 | Wang |
| 2009/0204268 A1* | 8/2009 | Eaves ............... H02H 3/30 700/293 |
| 2012/0032813 A1 | 2/2012 | Chen |
| 2014/0312877 A1 | 10/2014 | Kammer |

* cited by examiner

*Primary Examiner* — Carlos D Amaya
(74) *Attorney, Agent, or Firm* — NovoTechIP International PLLC

(57) ABSTRACT

A current consumed by an electric consumer is sampled as a first sampled current, and a main current sensor samples a current provided by an electric supply system as a second sampled current. A fault current detector detects a fault current between the electric supply system and the electric consumer, based on a non-zero difference between the first sampled current and the second sampled current and, in response, generates a circuit break signal. A residual current device receives the circuit break signal and, in response, to breaks a circuit between electric supply system and the electric consumer.

9 Claims, 6 Drawing Sheets

SYSTEM AND METHOD FOR PROTECTION AGAINST ELECTRIC SHOCK

CROSS REFERENCE TO RELATED APPLICATION

This application claims the benefit of priority from U.S. Provisional Patent Application Ser. No. 62/307,593, filed on Mar. 14, 2016, and entitled "A PROTECTION MODULE FOR ELECTROCUTION," which is incorporated herein by reference in its entirety.

TECHNICAL FIELD

The present application generally relates to an electric shock protection system for protecting a person in case of both direct and indirect electric contact.

BACKGROUND

Residual current protective devices (RCDs) are protective devices in electrical systems and installations for protection against indirect contacts, i.e., electric contacts of people with exposed conductive parts that may have become live under fault conditions. RCD's may be required as protective measures in special areas of electrical systems and installations.

An RCD may operate based on the fact that the vector sum of all currents on the current-carrying conductors of a supply line is zero in the fault-free operation of an electrical installation and no induction is generated in a magnet core of the RCD. If because of an insulation fault a residual current occurs, which is discharged into a body or to ground outside of the supply line, a differential current is caused. A current is induced on the secondary side via the variable magnetic field of that differential current, said current triggering a power switch which separates the faulty supply line.

However, in case of a direct contact, i.e., the electric contact of the person with a conductor or a conductive part intended to be energized in normal operation an RCD or any common protective devices may not be capable of breaking the circuit with sufficient responsiveness to protect against electric shock or even electrocution of the person. Therefore there is a need in the art for an electrocution protection system that is capable of protecting a person in case of both direct and indirect electric contact.

SUMMARY

In one general aspect, the present disclosure describes an electrocution protection system installed between a single-phase electric supply system and an electric consumer. The electrocution protection system may include a functional module having a current sensor that may be configured to sample current consumed by the electric consumer as a first sampled current; a main module that may be configured to detect a current leakage between the single-phase electric supply system and the electric consumer. The main module may include a main current sensor that may be configured to sample the current provided by the single-phase electric supply system as a second sampled current; and a fault current detector that may be configured to detect a fault current between the single-phase electric supply system and the consumer. The fault current may be a non-zero difference between the first and the second sampled currents. In an aspect, the system can include a residual current device that may be connected with the main module. The main module may send a signal to the residual current device in case the fault current is detected by the fault current detector. The residual current device may break the circuit between the single-phase electric supply system and the consumer upon the receipt of the signal.

In another general aspect, the present disclosure describes an electrocution protection system installed between a three-phase electric supply system and an electric consumer. The protection system may include a functional module having a current sensor that may be configured to sample current consumed by the electric consumer as a first sampled current. The system can also include a main module that may be configured to detect a current leakage between the three-phase electric supply system and the electric consumer. The main module may include a main current sensor that may be configured to sample the sum of currents provided by the three-phase electric supply system in three phase conductors as a second sampled current, and may include a fault current detector that may be configured to detect a fault current between the three-phase electric supply system and the electric consumer. The fault current may be a non-zero difference between the first and the second sampled currents. The system can also include an opto-triac switch, and a residual current device that may be connected with the main module. The main module may send a signal to the opto-triac switch in response to a fault current being detected by the fault current detector. The signal may be transferred to the residual current device which in an aspect, responds by breaking the circuit between the three-phase electric supply system and the consumer.

DETAILED DESCRIPTION

Disclosed herein is an electrocution protection system that may be configured for protecting a person from being electrocuted in both direct and indirect contacts. As used herein, direct contact means the electric contact of the person with a conductor or a conductive part intended to be energized in normal operation; while indirect contact means electric contact of the person with exposed conductive parts that may have become live under fault conditions.

Figure 1:
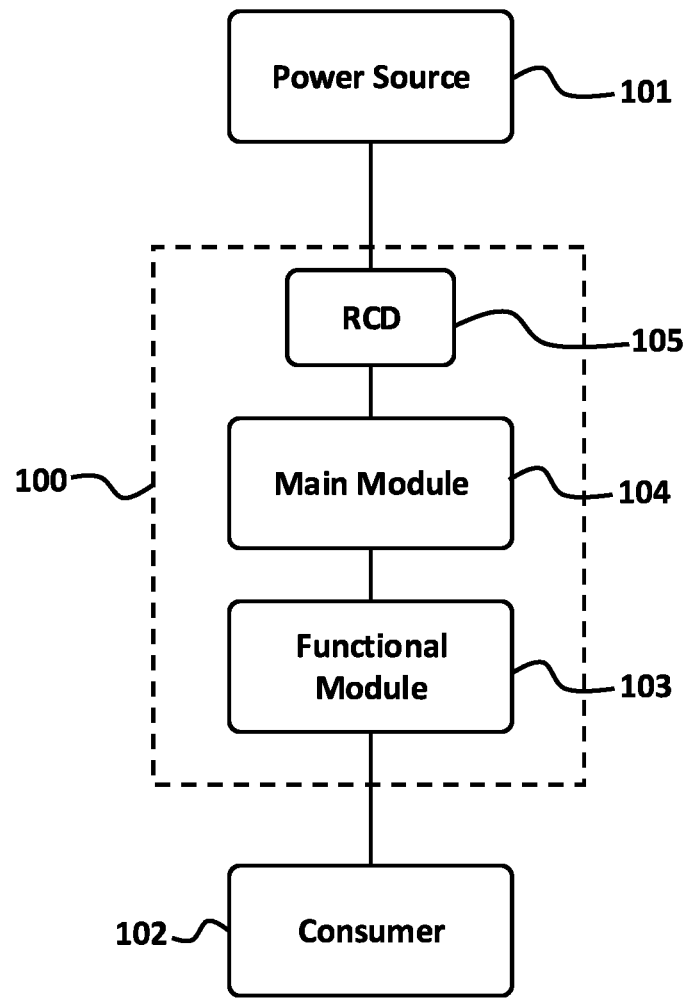
FIG. 1 illustrates a simple block diagram of an example of the electrocution protection system, according to one or more aspects of the present disclosure.

FIG. 1 illustrates a simplified block diagram of one electrocution protection system 100 according to one or more aspects of the present disclosure. The electrocution protection system 100 may be installed between a power source 101 and a consumer 102, and may include a functional module 103, a main module 104 and a residual current protective device (RCD) 105. The functional module 103 may be installed on the consumer side and it may be configured for measuring current consumption by the consumer 102. The functional module 103 may transmit the measured current consumption to the main module 104. The main module 104 may be configured for measuring the current provided by the power source 101 and comparing the current consumption by the consumer, as transmitted by the functional module 103, against the measured current provided by the power source 101 in order to detect any kind of current leakage between the power source 101 and the consumer 102. In case of a current leakage, the main module 104 may be configured to send a signal to the RCD 105 to break the circuit. Benefits of these features may include, but are not limited to, detecting a current leakage in case of both direct and indirect electric contacts of a person with live parts and breaking the circuit to prevent serious harm or death due to a possible electric shock.

Figure 2A:
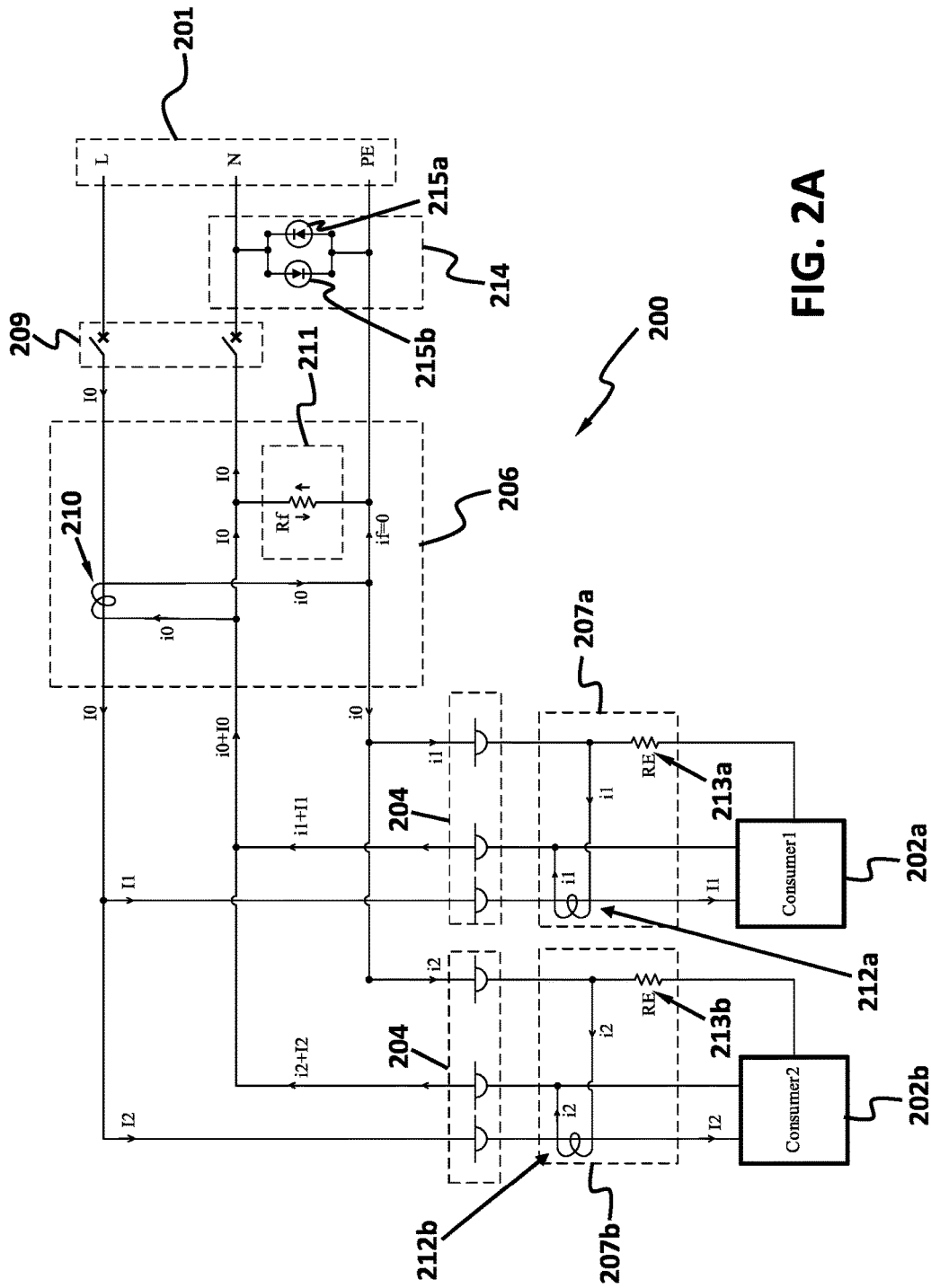
FIG. 2A shows a circuit schematic of an example of a single-phase electrocution protection system in a fault-free operation, according to exemplary implementations of the present disclosure.
Figure 2B:
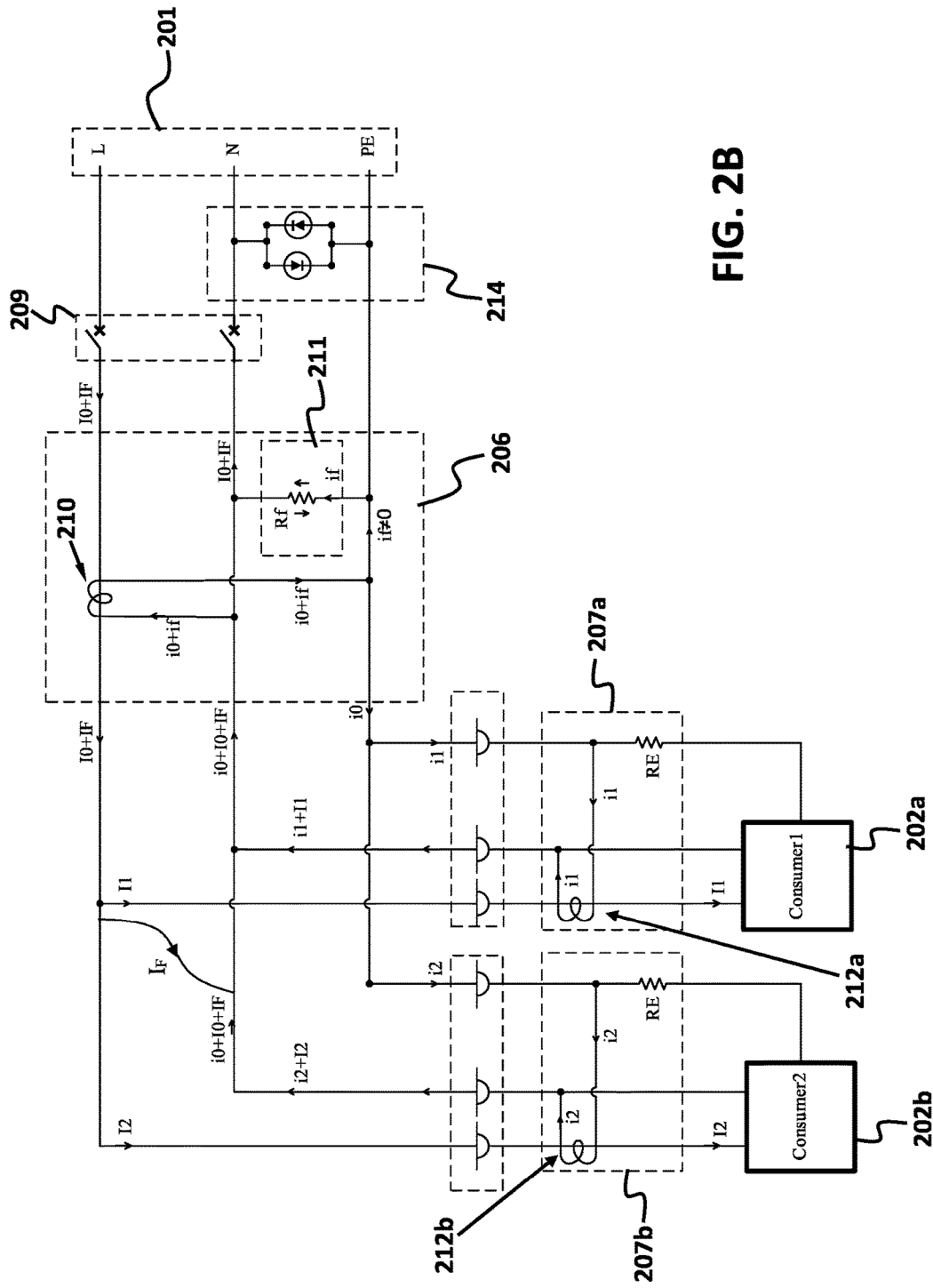
FIG. 2B shows a circuit schematic of an example of a single-phase electrocution protection system in a fault condition, according to exemplary implementations of the present disclosure.

FIG. 2A illustrates a circuit schematic of one example single-phase electrocution protection system 200 according to various aspects of the present disclosure. The single-phase electrocution protection system 200 can provide one exemplary implementation of the electrocution protection system 100 of FIG. 1. FIG. 2A illustrates the single-phase electrocution protection system 200 in a no fault condition. FIG. 2B, described in greater detail in later paragraphs, illustrates the single-phase electrocution protection system 200 in a fault condition. Referring to FIG. 2A, the single-phase electrocution protection system 200 may be installed between an electric supply system 201 and, for example, two consumers, labeled 202a and 202b, respectively. The electric supply system 201 may be connected to earthed electric sockets 204 by active conductors (i.e., a phase L and a neutral or null N) and a protective earth conductor PE.

Referring to FIG. 2A, for purposes of describing exemplary operations and features, the portion of the phase L active conductor that extends from the electric supply system 201 to the electrical sockets 204 will be alternatively referenced as the "supply live conductor" L. In like manner, the portion of the phase N active conductor that extends from the electric supply system 201 to the electrical sockets 204 will be alternatively referenced as the "supply neutral conductor" N, and the portion of the phase PE active conductor that extends from the electric supply system 201 to the electrical sockets 204 will be alternatively referenced as the "supply earth potential conductor" PE.

Also for purposes of description, the portion of the phase L active conductor that extends from the electrical socket 204 corresponding to Consumer 1 to Consumer 1 will be alternatively referenced as the "first consumer live conductor" L; the portion of the phase N active conductor that extends from that electrical socket 204 to Consumer 1, will be alternatively referenced as the "first consumer neutral conductor" N; and the portion of the phase PE active conductor that extends from the Consumer 1 electrical socket 204 to Consumer 1 will be alternatively referenced as the "first consumer earth potential conductor" PE.

For similar purposes of description, the portion of the phase L active conductor that extends from the electrical socket 204 corresponding to Consumer 2 to Consumer 2 will be alternatively referenced as the "second consumer live conductor" L; the portion of the phase N active conductor that extends from that electrical socket 204 to Consumer 2, will be alternatively referenced as the second consumer neutral conductor" N; and the portion of the phase PE active conductor that extends from the Consumer 2 electrical socket 204 to Consumer 2 will be alternatively referenced as the "second consumer earth potential conductor" PE.

FIG. 2A, the single-phase electrocution protection system 200 may include a main module 206, two exemplary similar functional modules 207a-b, and an RCD 209. The main module 206 may be connected to the electric supply system 201 via the RCD 209 and the main module 206 may include a main current sensor 210 and a fault current detector (FCD) 211. Each of the consumers 202a and 202b may be connected to a corresponding socket, labeled 204a and 204b, respectively, via a corresponding one of the functional modules 207a and 207b.

Each of the functional modules 207a and 207b may include a current sensor and a resistor, such as illustrated by the example current sensor 212a and resistor 213a of functional module 207a, and the example current sensor 212b and resistor 213b of functional module 207b. The current sensors 212a and 212b may be configured for measuring current consumption by consumers 202a and 202b, respectively.

Referring to FIG. 2A, in an exemplary implementation, a current $I_0$ can be provided by the power supply system 201 in the phase L conductor, and may be divided between sockets 204a and 204b as currents $I_1$ and $I_2$. Current sensor 210 in the main module 206 may sample current $I_0$ as $i_0$. Current sensor 212a may sample current $I_1$ as $i_1$ and current sensor 212b may sample current $I_2$ as $i_2$. A resultant vector formed by sampled currents $i_1$ and $i_2$ can be compared to the $i_0$ sampled by current sensor 210 in the main module 206. The difference between sampled current $i_0$ and the resultant vector of $i_1$ and $i_2$ is designated as a fault current $i_f$. The resistor $R_f$ of the FCD 211 may detect the fault current $i_f$. In the case shown in FIG. 2A, no fault current exists, therefore $i_f$ equals zero. In other words, the FCD 211 senses no current, which can be an indication of the system 200 being in equilibrium.

Referring to FIG. 2A, in some implementations, a voltage limiter 214 may be provided to protect the circuit elements against connection of the phase L conductor with the conductive parts of the consumer devices. The voltage limiter 214 may be implemented, for example, using two diodes 215a and 215b that may be connected with one another in a reversed and parallel configuration. Based on their configuration, in case of an unwanted connection of the phase L conductor with the conductive parts of the consumer devices, one of the diodes 215a or 215b may create a short circuit between N and PE and the unwanted current can travel along the PE. Furthermore, the resistors 213a-b in functional modules 207a-b may prevent the formation of a short circuit between two ends of the $R_f$ resistor of the FCD 211. According to some implementations, in case of any connection between the phase L and PE or the null N and PE, the RCD 209 may break the circuit.

FIG. 2B shows the circuit schematic of the single-phase electrocution protection system 200 of FIG. 2A in a fault condition. Referring to FIG. 2B, any access to the conductors phase L and null N without the functional modules 207a-b creates a fault current $I_F$. The current sensor 210 samples fault current $I_F$, as a result the sampled current by the main module 206 becomes $i_f+i_0$. Current sensor 212a may sample current $I_1$ as $i_1$ and current sensor 212b may sample current $I_2$ as $i_2$. If the resultant current of $i_1$ and $i_2$ is equal to $i_0$, then the difference between sampled current $i_0$ and the resultant vector of $i_1$ and $i_2$, which is designated as $i_f$, is not equal to zero, as was the case with the no-fault condition of the system 200 described above in reference to FIG. 2A. The FCD 211 senses this fault current and as a result the RCD 209 breaks the circuit.

Figure 3:
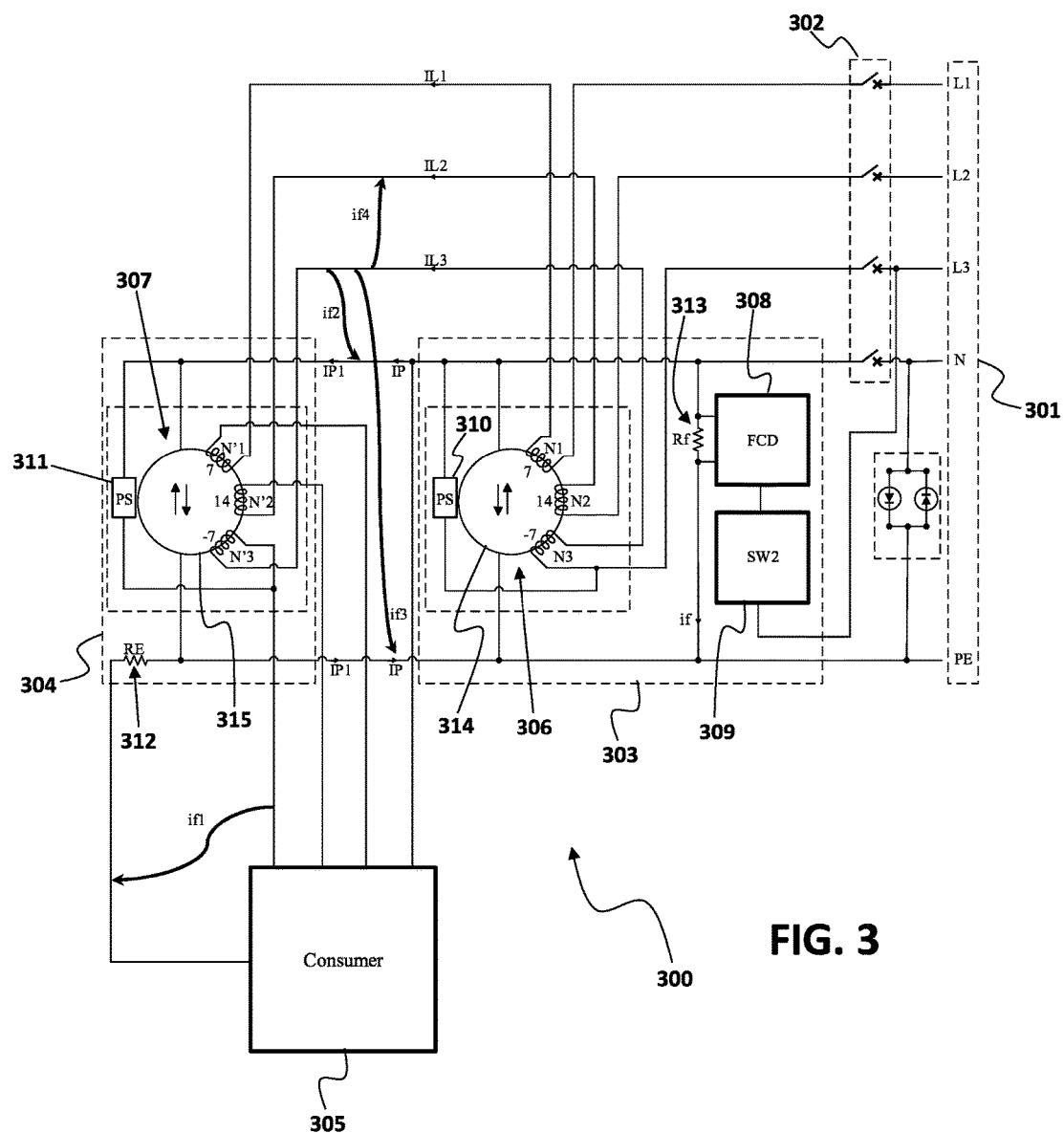
FIG. 3 shows a circuit schematic of an example of a three-phase electrocution protection system, according to exemplary implementations of the present disclosure.

FIG. 3 shows a circuit schematic of an example of a three-phase electrocution protection system 300 that may be configured to provide an exemplary implementation of the electrocution protection system 100 of FIG. 1. The three-phase electrocution protection system 300 may be installed between an electric supply system 301 and a consumer 305. The electric supply system 301 may be connected to the consumer 305 by active conductors (i.e., three phases $L_1$, $L_2$, $L_3$ and a neutral or null N) and a protective earth conductor PE.

Referring to FIG. 3, the three-phase electrocution protection system 300 may include a main module 303, an exemplary functional module 304, and an RCD 302. The main module 303 may be connected to the electric supply system 301 via the RCD 302. In an implementation, the main module 303 may include a main current sensor 306, a fault current detector (FCD) 308, an opto-triac switch 309, and a main power supply 310. The consumer 305 may be connected to the functional module 304. The main current sensor 306 may sample the source currents in conductors $L_1$, $L_2$, and $L_3$, where the resultant vector of the sampled source currents is designated as $I_P$. The currents in conductors $L_1$, $L_2$, and $L_3$ are designated as $I_{L1}$, $I_{L2}$, and $I_{L3}$.

In an implementation, the functional module 304 may include a current sensor 307, a resistor 312, and a functional power supply 311. The current sensor 307 may sample the currents in conductors $L_1$, $L_2$, and $L_3$ on the consumer side, where the resultant vector of the sampled consumed currents is designated as $I_{P1}$. The sampled currents by the functional module 304 may be transmitted to the main module 303 via conductor null N and conductor protective earth PE. This transmission can be beneficial since these conductors exist in most electrical systems.

As shown in FIG. 3, the resultant current of $I_P$ and $I_{P1}$ that is designated as $i_f$ may be detected by $R_f$ 313 and after being transformed into a voltage it may be dropped on the FCD 308. In a fault-free operation, $i_f$ equals zero, however if a fault condition happens, for example one of the fault conditions shown in FIG. 3 which are designated as $if_1$ to $if_4$, then $i_f$ will not equal zero anymore, therefore a voltage may be dropped on the FCD 308. Then the dropped voltage may be transformed into an artificial current of for example 30 mA by the FCD 308 and the opto-triac switch 309. The artificial current may then run the RCD 302 to break the circuit.

According to some implementations, current sensor 306 may include a sensor body 314 and the three conductors L1, L2, and L3 may be connected to current sensor 306 and they may be wound around the sensor body 314 as coils N1, N2, and N3.

Generally, current $I_P$ may be calculated as follows:

$$\vec{I}_P = k\vec{I}_{L1} + 2k\vec{I}_{L2} - k\vec{I}_{L3} \quad \text{Equation (1)}$$

where, $$k = N/G \quad \text{Equation (2)}$$

In Equation (2), k denotes the conversion ratio; N denotes the number of turns in a coil; and G is a constant equal to 2000. Current $I_{P1}$ may be calculated as follows:

$$\vec{I}_{P1} = -\vec{I}_P \quad \text{Equation (3)}$$

The total fault current, $i_f$, may be calculated as follows:

$$if = k(if_2 + if_3 + if_4) - (if_1 + if_3) \quad \text{Equation (4)}$$

In Equation (4) above, $if_1$ designates a fault between one of the phase conductors L1, L2, or L3 and the PE conductor on consumer side (i.e., after the coils of current sensor 307 of the functional module 304); $if_2$ designates a fault between one of the phase conductors L1, L2, or L3 and the null conductor N; $if_3$ designates a fault between one of the phase conductors L1, L2, or L3 and the PE conductor on the source side (i.e., between the main module 303 and the functional module 304); and $if_4$ designates a fault between any pairs of phase conductors L1, L2, and L3.

In some implementations, current sensor 307 may include a sensor body 315 and the current sensor 307 may be connected to the sensor 306 in a series configuration. The three phase conductors L1, L2, and L3 coming out of the sensor 306 may be connected to current sensor 307 and may be wound around the sensor body 315 as coils N'1, N'2, and N'3.

According to some implementations, the power supply 310 of current sensor 306 may be connected to one of the phase conductors L1, L2, or L3 before their connection to current sensor 306 and the power supply 311 of current sensor 307 may be connected to one of the phase conductors L1, L2, or L3 after current sensor 307, in order to avoid detection of these power supplies 310, 311 as a fault.

According to one or more example implementations, coils N1, N2, and N3 may have 7, 14, and 7 turns, respectively. It will be understood that 7, 14, and 7 are only examples, and are not intended to convey preferences, and are not intended to limit the scope of practices according to this disclosure. N1 and N3 may be wound in reverse directions. Coils N'1, N'2, and N'3 may have 7, 14, and 7 turns, respectively. N'1 and N'3 may be wound in reverse directions. Benefits from these features may include, but are not limited to distinguishing the faults between any pairs of phase conductors L1, L2, and L3.

Figure 4:
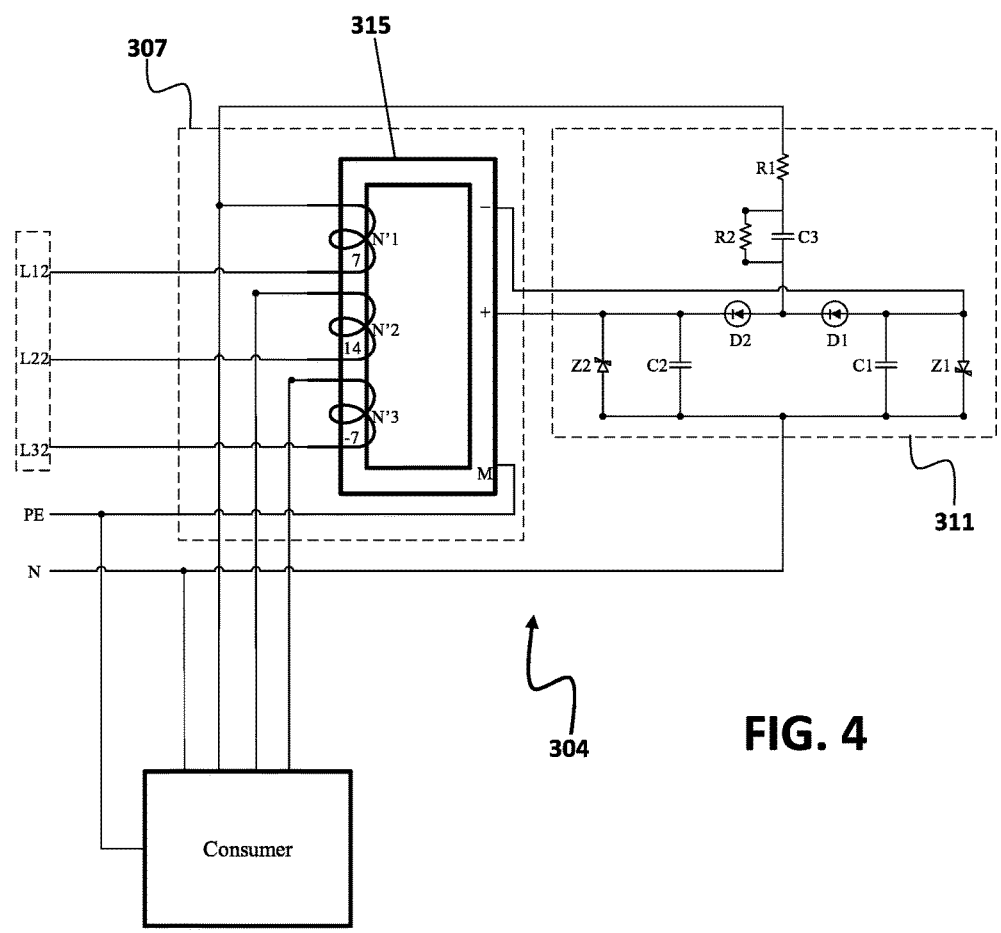
FIG. 4 illustrates an example circuit schematic of a functional module, according to exemplary implementations of the present disclosure.

FIG. 4 illustrates an exemplary functional module 304 configured to be an exemplary implementation of FIG. 1 functional module 103. Referring to FIG. 4, the functional module 304 may include the current sensor 307 and the power supply 311. The current sensor 307 may include the sensor body 315 and three coils N'1, N'2, and N'3 wound around the sensor body 315 with different number of turns, for example 7 turns for coil N'1, 14 turns for coil N'2, and −7 turns for coil N'3. As used herein, the minus sign before the number of turns shows a reverse direction of winding.

The power supply 311 may be a capacitive non-isolated power supply that may provide DC voltages of, for example PS. The common voltage pin of current sensor 307, which is designated as M, may be connected to the protective earth conductor PE. In an exemplary implementation, the power supply 311 may include: a voltage limiter having a capacitor C3 a resistor R1, a discharge resistor R2, a diode D1, capacitor C1 and a Zener diode Z1 to provide a voltage of for example—PS volts for the negative pin of current sensor 307; and diode D2, capacitor C2 and zener diode Z2 to provide a voltage of, for example, PS volts for the positive pin of current sensor 307. The common voltage pin of current sensor 307, which is designated as M may be connected to the protective earth conductor PE. In one example implementation, exemplary non-limiting values for the above-described components can include the capacitor C3 capacitance being 0.47 μF at 630 v, the resistor R1 resistance being, for example, 100Ω; and the discharge resistor R2 resistance being, for example, 220 kΩ. The diode D1, capacitor C1, and Zener diode Z1 can be configured to provide a voltage of, for example, −PS v for the negative pin of current sensor 307; and diode D2, capacitor C2 and Zener diode Z2 to provide a voltage of, for example, positive PS v for the positive pin of current sensor 307. One example value of PS, associated for example with example values of R1, R2, and C3, can be 5.6 volts.

Referring to FIG. 4, the currents L12, L22, and L32 may pass through coils N'1, N'2, and N'3 respectively and the resultant vector of the induced currents by the coils N'1, N'2, and N'3 can be transferred to the PE conductor via common voltage pin M.

Figure 5:
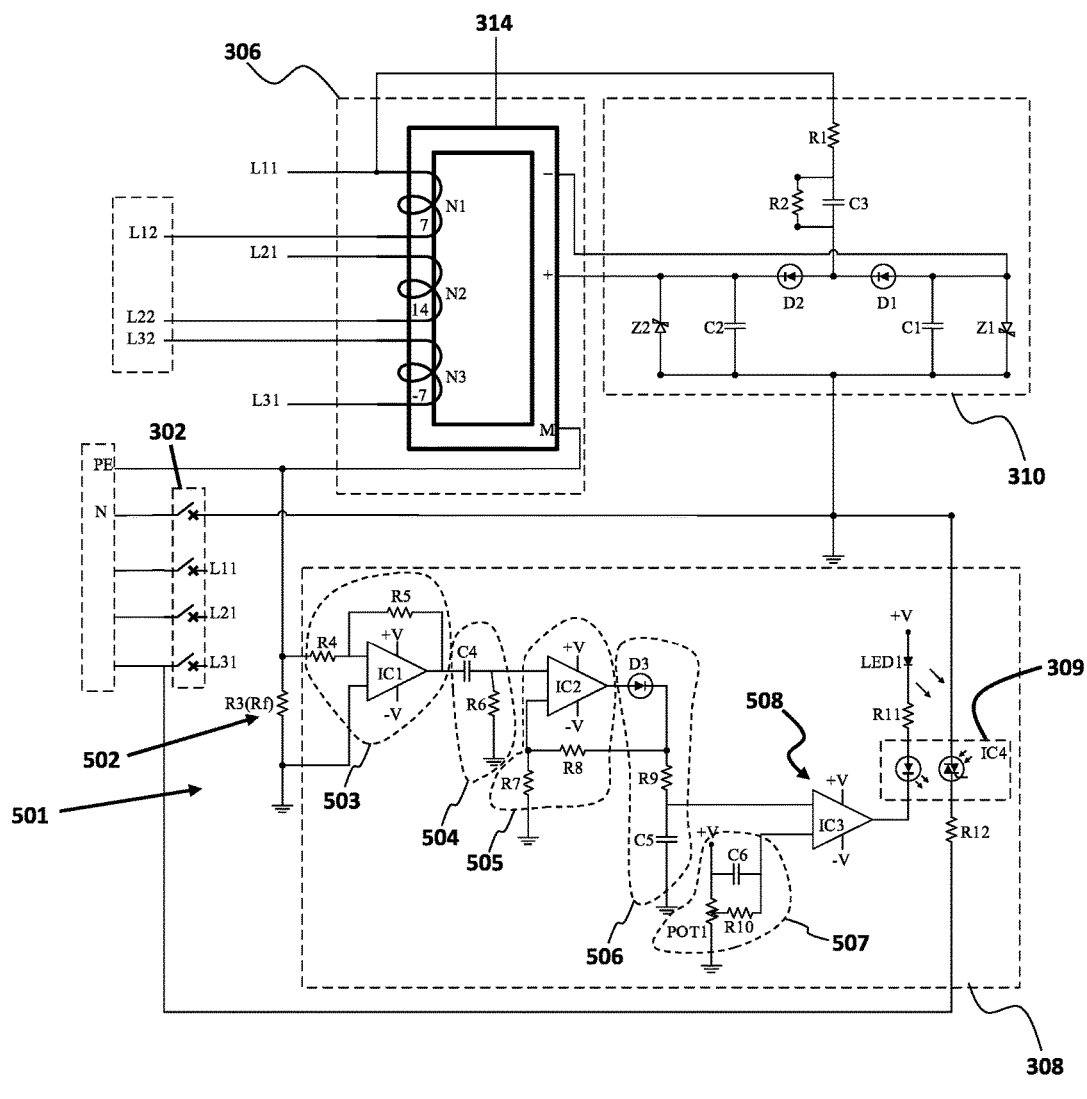
FIG. 5 illustrates an example circuit schematic of a main module, according to exemplary implementations of the present disclosure.

FIG. 5 illustrates an exemplary main module 303 configured to be an exemplary implementation of FIG. 1 main module 104. The main module 303 may include the current sensor 306, the power supply 310, FCD 308, and the opto-triac switch 309. The current sensor 306 may include the sensor body 314 and three coils N1, N2, and N3 wound around the sensor body 314 with different number of turns, for example 7 turns for coil N1, 14 turns for coil N2, and −7 turns for coil N3. As used herein, the minus sign before the number of turns shows a reverse direction of winding.

Referring to FIG. 5, the power supply 310 may be a capacitive non-isolated power supply that may provide DC voltages of ±5.6 v. The common voltage pin of current sensor 306, which is designated as M may be connected to the protective earth conductor PE. In an exemplary implementation, the power supply 310 may include: a voltage limiter having a capacitor C3 (for example, 0.68 μF, 630 v), a resistor R1 (for example, 100Ω), and a discharge resistor R2 (for example, 220 kΩ); diode D1, capacitor C1 and zener diode Z1 to provide a voltage of for example −5.6 v for the negative pin of current sensor 307; and diode D2, capacitor C2 and zener diode Z2 to provide a voltage of for example 5.6 v for the positive pin of current sensor 306.

Referring to FIG. 5, the currents L12, L22, and L32 may pass through coils N1, N2, and N3 respectively and the resultant vector of the induced currents by the coils N1, N2, and N3 is transferred to the PE conductor via common voltage pin M as the output current of the sensor 306. The output current may then be sent to a fault current detection circuit that may include the resistor $R_3$ 502 (labeled as $R_f$ 313 in FIG. 3), the FCD 308, and the opto-triac switch 309. The $R_3$ 502 may be connected with the FCD 308 with a parallel configuration.

With further reference to FIG. 5, in an implementation, the FCD 308 may include a first voltage amplifier 503, a high-pass filter 504, a second voltage amplifier 505, a DC converter 506, a reference voltage provider 507, and a comparator IC 508. The fault current that may be sensed by the current sensor 306 may be transformed into a voltage by the $R_3$ 502, and this voltage is dropped on the FCD 308 as an input voltage.

The first voltage amplifier 503 may be configured to amplify the input voltage by a factor of, for example, 1000 times. The amplified voltage may then pass through the high-pass filter 504 where the DC part of the amplified signal may be removed. The second voltage amplifier 505 may be configured to amplify the filtered signal by a factor of, for example, 80 times. The amplified filtered signal may then be sent to the DC converter 506 where it may be converted into a DC voltage that may be dropped on a first pin of the comparator IC 508 and it may be compared to the reference voltage that may be provided by the reference voltage provider 507 and may be dropped on a second pin of the comparator IC 508. After this comparison, if the voltage dropped on the first pin is greater than the reference voltage dropped on the second pin (i.e., a current leakage exists), then the comparator IC 508 will generate a signal in its output current. This signal may be transferred as a 30 mA current by the opto-triac switch 309 to the RCD 302 to trigger the RCD 302 to break the circuit.

With reference to FIG. 5, according to exemplary implementations, the first voltage amplifier 503 may include an OP-AMP designated as IC1 and two resistors designated as R4 (e.g., a 1 kΩ resistor) and R5 (e.g., a 1 MΩ resistor). The second voltage amplifier 505 may include an OP-AMP designated as IC2; and two resistors designated as R7 (e.g., a 2.7 kΩ resistor) and R8 (e.g., a 220 kΩ resistor). One example implementation of the OP-AMP IC1 can be, but is not limited to, an OP37G or equivalent. One example implementation of the OP-AMP IC2 can be, but is not limited to, an LM358 or equivalent.

Referring to FIG. 5, according to exemplary implementations, the high-pass filter 504 may include a grounded resistor designated as R6 (e.g., a 1 kΩ resistor) and a capacitor designated as C4 (e.g., a 100 μF capacitor). The DC converter 506 may include a resistor that is designated as R9 (e.g., a 47 kΩ resistor), a diode designated as D3, and a capacitor designated as C5 (e.g., a 202 μF capacitor).

According to some implementations, the reference voltage provider 507 may include a capacitor designated as C6 (e.g., a 100 μF capacitor), a resistor that is designated as R10 (e.g., a 12 kΩ resistor), and a grounded potentiometer designated as POT1 (e.g., a 5 kΩ potentiometer). One example implementation of the comparator IC 508 can be, but is not limited to, an LM359 or equivalent. One example implementation of the opto-triac switch 309 may be, but is not limited to, an MOC3052 or equivalent.

What is claimed is:

1. A system comprising:
a current sensor, configured to sample current consumed by an electric consumer as a first sampled current, the current sensor comprising a current sensor coil, wound around a consumer live conductor, the current sensor coil being connected between a consumer neutral conductor and a consumer earth potential conductor, the consumer live conductor extending from a socket connector to the electric consumer, the consumer neutral conductor extending from the socket connector to the electric consumer, and the consumer earth potential conductor extending from the socket connector to the electric consumer;
a main current sensor configured to sample a current provided by an electric supply system as a second sampled current, the main current sensor comprising a main sensor coil, wound around a supply live conductor, the main sensor coil being connected between a supply neutral conductor and a supply earth potential conductor, the supply live conductor extending from an electric supply system to the socket connector, the supply neutral conductor extending from the electric supply system to the socket connector, and the supply earth potential conductor extending from the electric supply system to the socket connector;
a fault current detector configured to detect a fault current between the electric supply system and the electric consumer, based on a non-zero difference between the first sampled current and the second sampled current and, in response, to generate a circuit break signal; and
a residual current device configured to receive the circuit break signal and, in response, to break a circuit between the electric supply system and the electric consumer.

2. The system of claim 1, wherein
the socket connector is a first socket connector,
the supply live conductor extends from the electric supply system to the first socket connector and to a second socket connector,
the supply neutral conductor extends from the electric supply system to the first socket connector and to the second socket connector,
the supply earth potential conductor extends from the electric supply system to the first socket connector and to the second socket connector,
the current sensor is a first consumer current detector, the current sensor coil is a first consumer current sensor coil, the consumer live conductor is a first consumer live conductor, the consumer neutral conductor is a first consumer neutral conductor, and the consumer earth potential conductor is a first consumer earth potential conductor, and wherein the current sensor further comprises
a second consumer current detector, including
a second current sensor coil, wound around a second consumer live conductor, a second consumer sensor coil being connected between a second consumer neutral conductor and a second consumer earth potential conductor, the second consumer live conductor extending from the second socket connector to a second consumer, the second consumer neutral conductor extending from the second socket connector to the second consumer, and the second consumer earth potential conductor extends from the second socket connector to the second consumer.

3. The system of claim 2, wherein
the main sensor coil is wound around the supply live conductor in a configuration that induces a sample main current flow through the main sensor coil,
the first consumer current sensor coil is wound around the first consumer live conductor in a configuration that induces a sample first consumer current flow through the first consumer current sensor coil, and
the second current sensor coil is wound around the second consumer live conductor in a configuration that induces a sample second consumer current flow through the second current sensor coil.

4. The system of claim 3, wherein the fault current detector includes a resistor coupled between the supply neutral conductor and the supply earth potential conductor, wherein the resistor is configured to produce a voltage drop between the supply neutral conductor and the supply earth potential conductor in response to a vector sum current being unequal to the sample main current flow, the vector sum current being a vector sum of the sample first consumer current flow and the sample second consumer current flow.

5. A system comprising:
a current sensor, configured to sample a sum of currents in three phase conductors consumed by an electric consumer as a first sampled current, the current sensor comprising the three phase conductors wound around a sensor body as a first consumer coil, a second consumer coil, and a third consumer coil; and
a main module configured to detect a current leakage between a three-phase electric supply system and the electric consumer, wherein the main module includes:
a main current sensor configured to sample a sum of currents provided by the three-phase electric supply system in three phase conductors as a second sampled current, the main current sensor comprising the three phase conductors wound around a main sensor body as a first coil, a second coil, and a third coil; and
a fault current detector configured to generate a fault current between the three-phase electric supply system and the electric consumer, based on a non-zero difference between the first sampled current and the second sampled current and, in response, to generate a fault signal; and
a residual current device, coupled to the main module, configured to receive the fault signal and, in response, to break a circuit between the three-phase electric supply system and the electric consumer.

6. A method, comprising:
sampling a current consumed by an electric consumer as a first sampled current by wounding a current sensor coil around a consumer live conductor, the current sensor coil being connected between a consumer neutral conductor and a consumer earth potential conductor, the consumer live conductor extending from a socket connector to the electric consumer, the consumer neutral conductor extending from the socket connector to the electric consumer, and the consumer earth potential conductor extending from the socket connector to the electric consumer;
sampling a current provided by an electric supply system as a second sampled current by wounding a main sensor coil around a supply live conductor, the main sensor coil being connected between a supply neutral conductor and a supply earth potential conductor, the supply live conductor extending from the electric supply system to the socket connector, the supply neutral conductor extending from the electric supply system to the socket connector, and the supply earth potential conductor extending from the electric supply system to the socket connector;
detecting a fault current between the electric supply system and the electric consumer, based on a non-zero difference between the first sampled current and the second sampled current and, in response, generating a circuit break signal; and
in response to the circuit break signal breaking a circuit between the electric supply system and the electric consumer.

7. The system of claim 1, wherein:
the main sensor coil is wound around the supply live conductor in a configuration that induces a sample main current flow through the main sensor coil, and
the current sensor coil is wound around the consumer live conductor in a configuration that induces a sample consumer current flow through the current sensor coil.

8. The system of claim 7, wherein:
the fault current detector includes a resistor coupled between the supply neutral conductor and the supply earth potential conductor, wherein the resistor is configured to produce a voltage drop between the supply neutral conductor and the supply earth potential conductor in response to the sample consumer current flow being unequal to the sample main current flow.

9. The system of claim 5, wherein:
the first consumer coil, the second consumer coil, and the third consumer coil are wound around the sensor body in a configuration that currents in the three phase conductors induce the first sampled current within the sensor body, the first sampled current transferred via a protective earth conductor to the fault current detector, and the first coil, the second coil, and the third coil are wound around the main sensor body in a configuration that currents in the three phase conductors induce the second sampled current within the sensor body, the second sampled current transferred via the protective earth conductor to the fault current detector.

* * * * *